(12) United States Patent
Endo et al.

(10) Patent No.: US 7,556,914 B2
(45) Date of Patent: Jul. 7, 2009

(54) PATTERN FORMATION METHOD

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 520 days.

(21) Appl. No.: 11/253,701

(22) Filed: Oct. 20, 2005

(65) Prior Publication Data

US 2006/0148266 A1 Jul. 6, 2006

(30) Foreign Application Priority Data

Jan. 6, 2005 (JP) .............................. 2005-001358

(51) Int. Cl.
*G03F 7/26* (2006.01)
(52) U.S. Cl. ...................... 430/311; 430/330
(58) Field of Classification Search .................. 430/311, 430/327, 961
See application file for complete search history.

(56) References Cited

U.S. PATENT DOCUMENTS

| 2003/0181055 A1 | 9/2003 | Wu et al. |
| 2003/0199406 A1 | 10/2003 | Anzures et al. |
| 2006/0008746 A1 | 1/2006 | Onishi et al. |
| 2006/0105272 A1* | 5/2006 | Gallagher et al. ........... 430/311 |
| 2006/0141400 A1* | 6/2006 | Hirayama et al. ........... 430/395 |
| 2007/0134593 A1 | 6/2007 | Hirayama et al. |

FOREIGN PATENT DOCUMENTS

| JP | 11-305442 A | 11/1999 |
| JP | 2002-296787 | 10/2002 |
| JP | 2003-316030 | 11/2003 |
| JP | 2004-006656 | 1/2004 |
| JP | 2004-356486 | 12/2004 |
| JP | 2006-049824 | 2/2006 |
| JP | 2006-113246 | 4/2006 |
| JP | 2006-184574 | 7/2006 |
| JP | 2006-186111 | 7/2006 |
| WO | WO 2004/074937 | 9/2004 |
| WO | WO 2004/076535 | 9/2004 |

OTHER PUBLICATIONS

Masaaki "Development Status for 193nm Immersion Lithography Materials" vol. LAV-04/No. 7-9 11-13, pp. 23-26 Oct. 25, 2004; with partial English Translation.
Japanese Office Action with English Translation issued in Japanese Paten Application No. 2005-001358 dated on Jan. 29, 2008.
Japanese Office Action, with English Translation, issued in corresponding Japanese Patent Application No. JP 2005-001358 mailed on Oct. 30, 2007.
M. Switkes, et al, "Immersion lithography at 157 nm," J. Vac. Sci. Tehcnol., Nov./Dec. 2001, pp. 2353-2356, vol. B16, No. 6, American Vacuum Society.
Bruce W. Smith, et al., "Approaching the numerical aperture of water—Immersion lithography at 193nm," Proceedings of SPIE, 2004, pp. 273-284, vol. 5377, Optical Microlithography XVII.

* cited by examiner

*Primary Examiner*—Kathleen Duda
(74) *Attorney, Agent, or Firm*—McDermott Will & Emery LLP

(57) ABSTRACT

In a pattern formation method, a resist film is formed on a substrate and a barrier film including a plasticizer is then formed on the resist film. Thereafter, with a liquid provided on the barrier film, pattern exposure is carried out by selectively irradiating the resist film with exposing light through the barrier film. Subsequently, after the pattern exposure, the resist film is developed after removing the barrier film, so as to form a resist pattern in a good shape without producing residues.

32 Claims, 11 Drawing Sheets

PATTERN FORMATION METHOD

CROSS-REFERENCE TO RELATED APPLICATIONS

This application claims priority under 35 U.S.C. § 119 on Patent Application No. 2005-1358 filed in Japan on Jan. 6, 2005, the entire contents of which are hereby incorporated by reference.

BACKGROUND OF THE INVENTION

The present invention relates to a pattern formation method for use in fabrication process or the like for semiconductor devices.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)). In the immersion lithography, a region in an exposure system sandwiched between a projection lens and a resist film formed on a wafer is filled with a liquid having a refractive index n (whereas n>1) and therefore, the NA (numerical aperture) of the exposure system has a value n·NA. As a result, the resolution of the resist film can be improved.

Also, in the immersion lithography, use of an acidic solution as an immersion liquid provided on a resist film has been proposed for further improving the refractive index (see, for example, B. W. Smith, A. Bourov, Y. Fan, L. Zavyalova, N. Lafferty, F. Cropanese, "Approaching the numerical aperture of water—Immersion Lithography at 193 nm", Proc. SPIE, Vol. 5377, p. 273 (2004)).

Now, a conventional pattern formation method employing the immersion lithography will be described with reference to FIGS. 9A through 9D, 10A and 10B.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Next, as shown in FIG. 9A, the aforementioned chemically amplified resist material is applied on a substrate 1 so as to form a resist film 2 with a thickness of 0.35 μm.

Then, as shown in FIG. 9B, a barrier film 3 made of a barrier film material having the following composition is formed on the resist film 2 by, for example, spin coating:

| | |
|---|---|
| Base polymer: polyvinyl hexafluoroisopropyl alcohol | 1 g |
| Solvent: n-butyl alcohol | 20 g |

Next, as shown in FIG. 9C, the resultant barrier film 3 is annealed with a hot plate at a temperature of 120° C. for 90 seconds.

Next, as shown in FIG. 9D, with a liquid (water) 4 provided on the resist film 2, pattern exposure is carried out by irradiating the resist film 2 with exposing light 5 of ArF excimer laser of a wavelength of 193 nm with NA of 0.68 through a mask 6.

After the pattern exposure, as shown in FIG. 10A, the resist film 2 is baked with a hot plate at a temperature of 105° C. for 60 seconds, and the resultant resist film is developed with a 2.38 wt % tetramethylammonium hydroxide developer. In this manner, a resist pattern 2a made of an unexposed portion of the resist film 2 and having a line width of 0.09 μm is formed as shown in FIG. 10B.

However, as shown in FIG. 10B, the resist pattern 2a obtained by the conventional pattern formation method is in a defective shape having what is called a T-top portion. Furthermore, residues 2b are produced.

SUMMARY OF THE INVENTION

The present inventors have variously examined the reason why the resist pattern formed by the conventional immersion lithography is in a defective shape, resulting in finding the following: In the immersion lithography, the barrier film 3 is provided between the resist film 2 and the liquid 4 in order to prevent performance degradation of the resist film 2 otherwise caused through contact between the immersion liquid 4 and the resist film 2. However, in removing the barrier film 3 after the exposure, the solubility of the barrier film 3 is so insufficient that the pattern failure occurs.

When the resist pattern 2a in such a defective shape is used for etching a target film, the resultant pattern of the target film is also in a defective shape, which disadvantageously lowers the productivity and the yield in the fabrication process for semiconductor devices.

In consideration of the aforementioned conventional problem, an object of the invention is forming a fine resist pattern in a good shape by improving the solubility (removability) of a barrier film provided on a resist film in the immersion lithography.

The present inventors have obtained, on the basis of the results of the aforementioned examination, first finding that the efficiency for removing a barrier film after exposure is improved when the barrier film includes a plasticizer. A plasticizer is a material principally having an ester bond. When the ester bond included in a plasticizer is reacted with alkali, an ester group is easily opened so as to produce carboxylic acid. Specifically, when a developer of an alkaline aqueous solution is supplied to exposed portions of a barrier film and a resist film after exposure, an ester bonding link of the plasticizer included in the barrier film reacts with the alkali, and hence, an acid derived from carboxylic acid is generated within the barrier film. Owing to the acid derived from carboxylic acid generated within the barrier film, the barrier film attains higher solubility in the alkaline developer. Accordingly, even when a sufficient amount of acid is not generated in the resist film through the exposure, the acid generated in the barrier film is supplied to a portion of the barrier film in contact with the resist film, resulting in improving the removal efficiency of the resist film. In other words, when the barrier film of this invention is used, the removal efficiency of the barrier film and the resist film in the development can be improved while preventing the contact between the resist film and the immersion liquid in the exposure.

Furthermore, the present inventors have obtained second finding that the removal efficiency of a barrier film is improved by removing the barrier film with an alcohol solution when the barrier film includes an alcohol solvent and with a warmed alkaline aqueous solution when the barrier film includes an alkali-soluble polymer. An alcohol solution is good at reactivity with a barrier film and permeability in a barrier film. Also, a warmed alkaline aqueous solution improves the activity of the alkaline aqueous solution itself. It is noted that the temperature of the warmed alkaline aqueous solution may be not lower than room temperature, and the upper limit of the temperature is a temperature at which the alkaline aqueous solution does not boil. Moreover, the temperature is preferably not lower than room temperature and not higher than 80° C. and is more preferably not lower than room temperature and not higher than 50° C.

The first pattern formation method of this invention attained on the basis of the first finding includes the steps of forming a resist film on a substrate; forming a barrier film including a plasticizer on the resist film; performing pattern exposure by selectively irradiating the resist film through the barrier film with exposing light with a liquid provided on the barrier film; removing the barrier film; and forming, after the pattern exposure, a resist pattern made of the resist film by developing the resist film after removing the barrier film.

In the first pattern formation method, since the barrier film provided for preventing direct contact between the liquid and the resist film includes a plasticizer, the barrier film can be easily removed. As a result, a fine pattern can be formed in a good shape through the development of the resist film performed after removing the barrier film.

The second pattern formation method of this invention attained on the basis of the first finding includes the steps of forming a resist film on a substrate; forming a barrier film including a plasticizer on the resist film; performing pattern exposure by selectively irradiating the resist film through the barrier film with exposing light with a liquid provided on the barrier film; removing the barrier film and forming a resist pattern made of the resist film by developing the resist film after the pattern exposure.

In the second pattern formation method, since the barrier film provided for preventing direct contact between the liquid and the resist film includes a plasticizer, the barrier film can be easily removed even when the barrier film is removed simultaneously with the development. As a result, a fine pattern can be formed in a good shape.

In this manner, the barrier film of this invention may be removed before or after the development, and either case has its own merit. In the case where the barrier film is removed before the development as in the first pattern formation method, an acid generated in removing the barrier film can be prevented from affecting an unexposed portion of the resist film. Alternatively, in the case where the barrier film is removed during the development of the resist film as in the second pattern formation method, the dissolution characteristic of the resist film can be advantageously controlled to be improved. Specifically, when the barrier film is removed simultaneously with the development, the dissolution characteristic of the resist film can be controlled to given extent.

Now, the dissolution characteristic of a resist film will be described with reference to FIG. 11. In general, when the dissolution characteristic of a resist film is high, the dissolution rate is abruptly increased when exposure exceeds a given threshold value (a threshold region of FIG. 11) (as shown with a graph A of a broken line in FIG. 11). As the change of the dissolution rate against the exposure is more abrupt, a difference in the solubility between an exposed portion and an unexposed portion of the resist film is larger, and hence, the resist pattern can be more easily formed in a good shape. Accordingly, in the case where the barrier film is removed during the development, the dissolution rate is wholly lowered correspondingly to the removal of the barrier film, and hence, the change in a portion surrounded with a circle C in FIG. 11 can be reduced to be flatter. As a result, in the case where the actual resist film has the dissolution characteristic as shown with a graph B, the dissolution rate attained with smaller exposure can be adjusted to be comparatively constant at a low dissolution rate even when the small exposure varies to some extent. Accordingly, a difference in the solubility between an exposed portion and an unexposed portion of the resist film can be easily increased, resulting in easily forming a resist pattern in a good shape.

In the first pattern formation method, an aqueous solution used for removing the barrier film may be an aqueous solution having hydrogen ion concentration exponent (pH) sufficient for dissolving the barrier film. For example, a developer or a diluted developer may be used. With respect to the degree of dilution of the diluted developer, the concentration is lower than that of a general developer, i.e., a 2.38 wt % tetramethylammonium hydroxide aqueous solution, and is preferably, for example, not less than 0.01% and not more than 2%, which does not limit the invention.

In the first or second pattern formation method, the plasticizer can be phthalate ester, adipate ester, azelate ester, sebacate ester, phosphate ester, trimellitate ester, citrate ester, epoxy, or chlorinated paraffin.

In this case, the phthalate ester can be dimethyl phthalate, diethyl phthalate, dibutyl phthalate, di-2-ethylhexyl phthalate, di-n-octyl phthalate, diisononyl phthalate, dinonyl phthalate, diisodecyl phthalate or butyl benzyl phthalate. The adipate ester can be dioctyl adipate or diisononyl adipate. The azelate ester can be dioctyl azelate. The sebacate ester can be dibutyl sebacate or dioctyl sebacate. The phosphate ester can be tricresyl phosphate. The trimellitate ester can be trioctyl trimellitate. The citrate ester can be acetyl tributyl citrate. The epoxy can be epoxidized soybean oil.

The content of the plasticizer in the barrier film is preferably approximately not less than 0.1 wt % and not more than 30 wt % based on a polymer included in the barrier film, which does not limit the invention. In some cases, the content may be preferably not less than 1 wt % and not more than 10 wt % based on the polymer included in the barrier film.

A conventional technique in which a resist film includes a plasticizer is disclosed in, for example, Japanese Laid-Open Patent Publication No. 11-305442. In this conventional technique, the use (function) of the plasticizer is improvement of the performance of the resist film itself, such as improvement of application properties of the resist film, and there is no description in this publication that a plasticizer included in a barrier film reacts with alkali to improve the solubility of the barrier film as in this invention.

The third pattern formation method of this invention attained on the basis of the second finding includes the steps of forming a resist film on a substrate; forming a barrier film including an alcohol solvent on the resist film; performing pattern exposure by selectively irradiating the resist film through the barrier film with exposing light with a liquid provided on the barrier film; removing the barrier film with an alcohol solution; and forming, after the pattern exposure, a resist pattern made of the resist film by developing the resist film after removing the barrier film.

In the third pattern formation method, in the case where the barrier film provided for preventing direct contact between the liquid and the resist film includes the alcohol solvent, the barrier film is removed with the alcohol solution, and hence, the barrier film can be easily removed. As a result, a fine pattern can be formed in a good shape by developing the resist film after removing the barrier film.

The fourth pattern formation method of this invention attained on the basis of the second finding includes the steps of forming a resist film on a substrate; forming a barrier film including an alkali-soluble polymer on the resist film; performing pattern exposure by selectively irradiating the resist film through the barrier film with exposing light with a liquid provided on the barrier film; removing the barrier film with a warmed alkaline aqueous solution; and forming, after the pattern exposure, a resist pattern made of the resist film by developing the resist film after removing the barrier film.

In the fourth pattern formation method, since the barrier film including the alkali-soluble polymer is removed with the warmed alkaline aqueous solution, the barrier film can be easily removed. As a result, a fine pattern can be formed in a good shape by developing the resist film after removing the barrier film.

In the fourth pattern formation method, the alkaline aqueous solution can be a tetramethylammonium hydroxide aqueous solution, a tetraethylammonium hydroxide aqueous solution or a choline aqueous solution.

In the third or fourth pattern formation method, the barrier film preferably includes a plasticizer. Thus, the solubility of the barrier film can be further improved.

Each of the first through fourth pattern formation methods preferably includes, before the step of performing pattern exposure, a step of annealing the barrier film. Thus, the denseness of the barrier film is improved, so that the insolubility thereof in the liquid provided thereon in the exposure can be increased. However, when the denseness of the barrier film is increased too much, it becomes difficult to dissolve the barrier film for removal, and therefore, it is preferably annealed at a temperature in an appropriate range. For example, the temperature is preferably not less than 100° C. and not more than 150° C., which does not limit the invention.

In each of the first through fourth pattern formation methods, the liquid can be water or an acidic solution.

In this case, the acidic solution can be a cesium sulfate aqueous solution or a phosphoric acid aqueous solution.

In each of the first through fourth pattern formation methods, the exposing light can be KrF excimer laser, $Xe_2$ laser, ArF excimer laser, $F_2$ laser, KrAr laser or $Ar_2$ laser.

DETAILED DESCRIPTION OF THE INVENTION

Embodiment 1

A pattern formation method according to Embodiment 1 of the invention will now be described with reference to FIGS. 1A through 1D, 2A and 2B.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 1A:
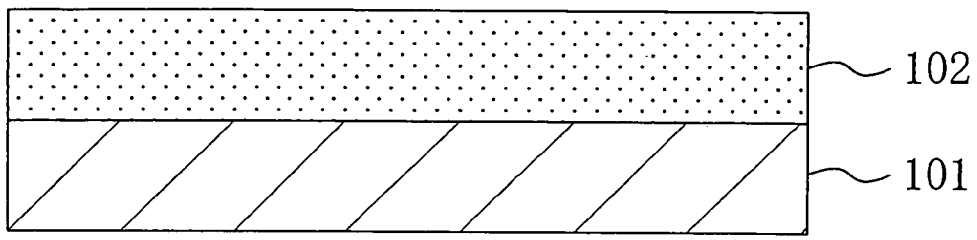
FIGS. 1A, 1B, 1C and 1D are cross-sectional views for showing procedures in a pattern formation method according to Embodiment 1 of the invention.

Next, as shown in FIG. 1A, the aforementioned chemically amplified resist material is applied on a substrate 101 so as to form a resist film 102 with a thickness of 0.35 μm.

Figure 1B:
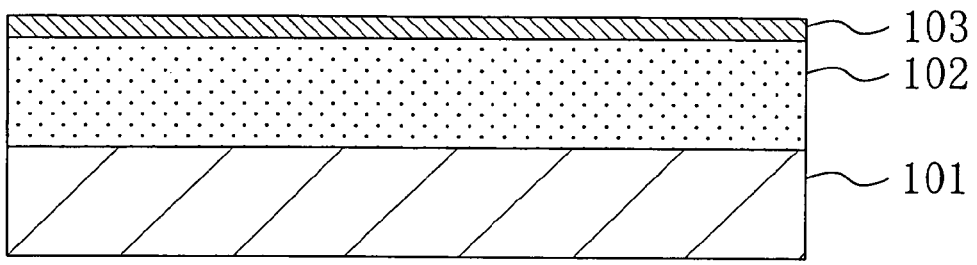

Then, as shown in FIG. 1B, a barrier film 103 having a thickness of 0.05 μm and made of a barrier film material having the following composition is formed on the resist film 102 by, for example, spin coating:

| | |
|---|---|
| Base polymer: polyvinyl hexafluoroisopropyl alcohol | 1 g |
| Plasticizer: di-n-octyl phthalate | 0.2 g |
| Solvent: n-butyl alcohol | 20 g |

Figure 1C:
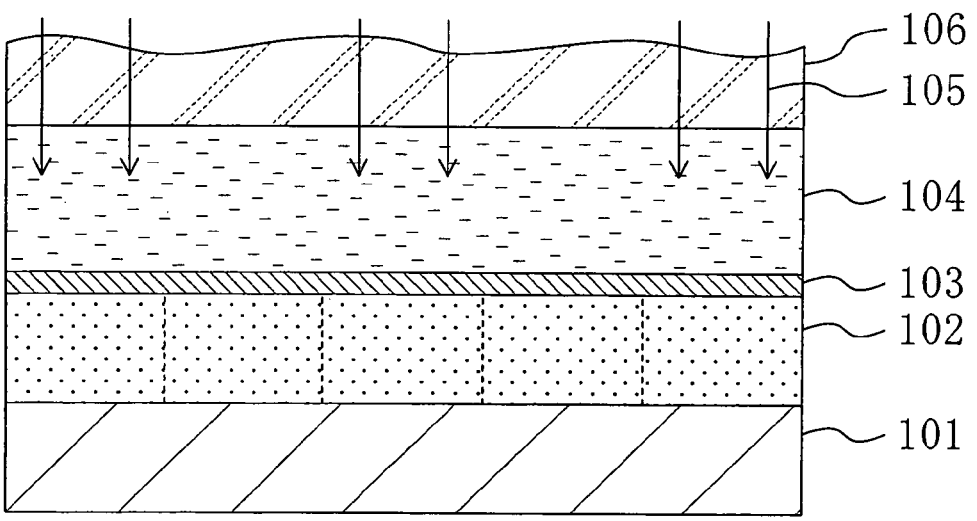

Next, as shown in FIG. 1C, with a liquid 104 of water provided between the barrier film 103 and a projection lens 106 by, for example, a puddle method, pattern exposure is carried out by irradiating the resist film 102 through the barrier film 103 with exposing light 105 of ArF excimer laser with NA of 0.68 having passed through a mask (not shown).

Figure 1D:
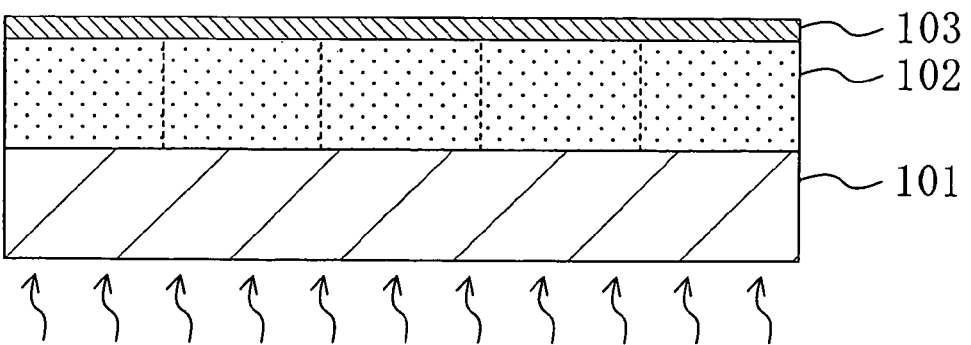

After the pattern exposure, as shown in FIG. 1D, the resist film 102 is baked with a hot plate at a temperature of 105° C. for 60 seconds (post exposure bake).

Figure 2A:
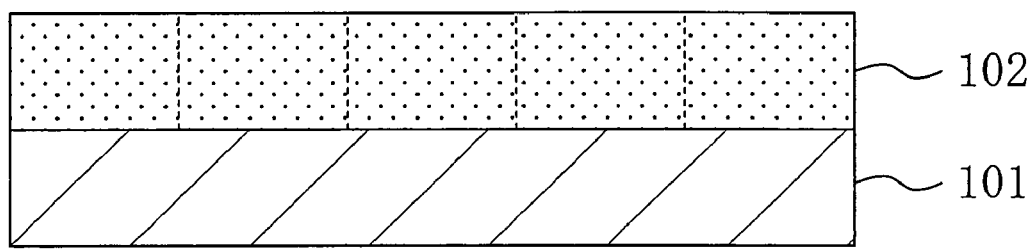
FIGS. 2A and 2B are cross-sectional views for showing other procedures in the pattern formation method of Embodiment 1.
Figure 2B:
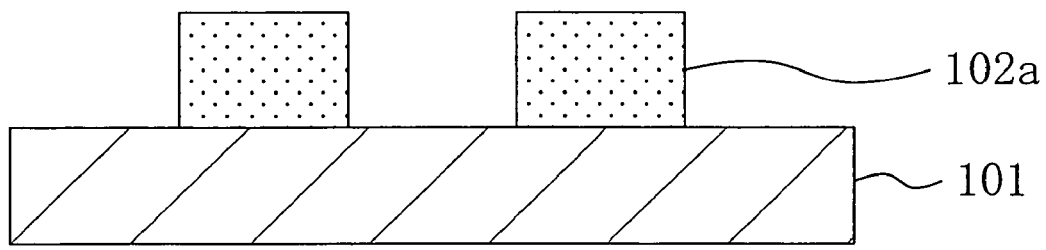

Next, as shown in FIG. 2A, the barrier film 103 is removed with, for example, a 0.005 wt % tetramethylammonium hydroxide aqueous solution (diluted alkaline developer), and thereafter, the resultant resist film 102 is developed with a 2.38 wt % tetramethylammonium hydroxide developer. In this manner, a resist pattern 102a made of an unexposed portion of the resist film 102 and having a line width of 0.09 μm is formed in a good shape as shown in FIG. 2B.

In this manner, according to Embodiment 1, the barrier film 103 formed on the resist film 102 in the barrier film forming step shown in FIG. 1B includes a plasticizer (that is, di-n-octyl phthalate), and hence, the barrier film 103 can be sufficiently removed in the barrier film removing step shown in FIG. 2A. As a result, the resist pattern 102a can be formed in a good shape without producing residues.

Embodiment 2

A pattern formation method according to Embodiment 2 of the invention will now be described with reference to FIGS. 3A through 3D, 4A and 4B.

First, a positive chemically amplified resist material having the following composition is prepared:

| | |
|---|---|
| Base polymer: poly((norbornene-5-methylene-t-butyl-carboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 3A:
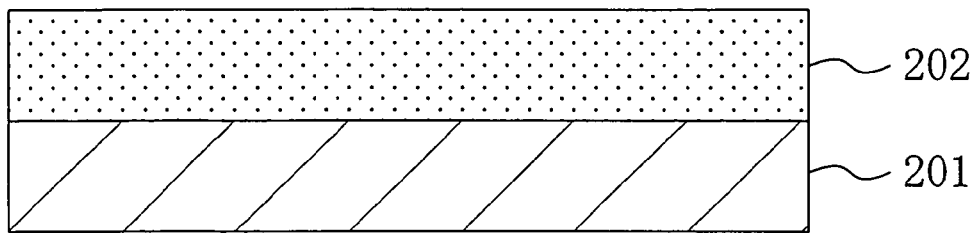
FIGS. 3A, 3B, 3C and 3D are cross-sectional views for showing procedures in a pattern formation method according to Embodiment 2 of the invention.

Next, as shown in FIG. 3A, the aforementioned chemically amplified resist material is applied on a substrate 201 so as to form a resist film 202 with a thickness of 0.35 μm.

Figure 3B:
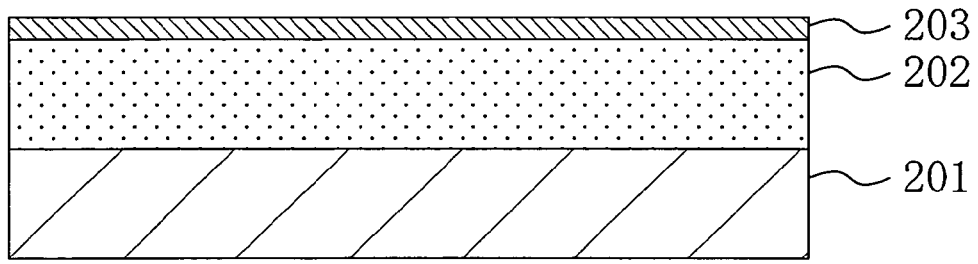

Then, as shown in FIG. 3B, a barrier film 203 having a thickness of 0.07 μm and made of a barrier film material having the following composition is formed on the resist film 202 by, for example, the spin coating:

| | |
|---|---|
| Base polymer: polyvinyl hexafluoroisopropyl alcohol | 1 g |
| Plasticizer: diisononyl adipate | 0.3 g |
| Solvent: n-butyl alcohol | 20 g |

Figure 3C:
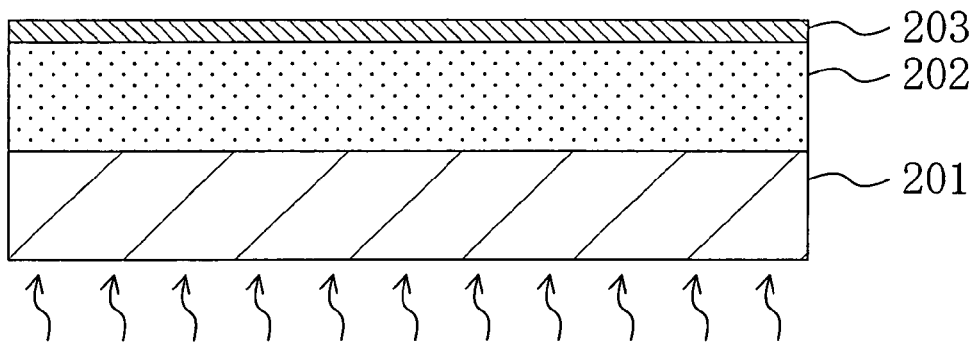

Next, as shown in FIG. 3C, the barrier film 203 is annealed with a hot plate at a temperature of 110° C. for 60 seconds, so as to improve the denseness of the barrier film 203.

Figure 3D:
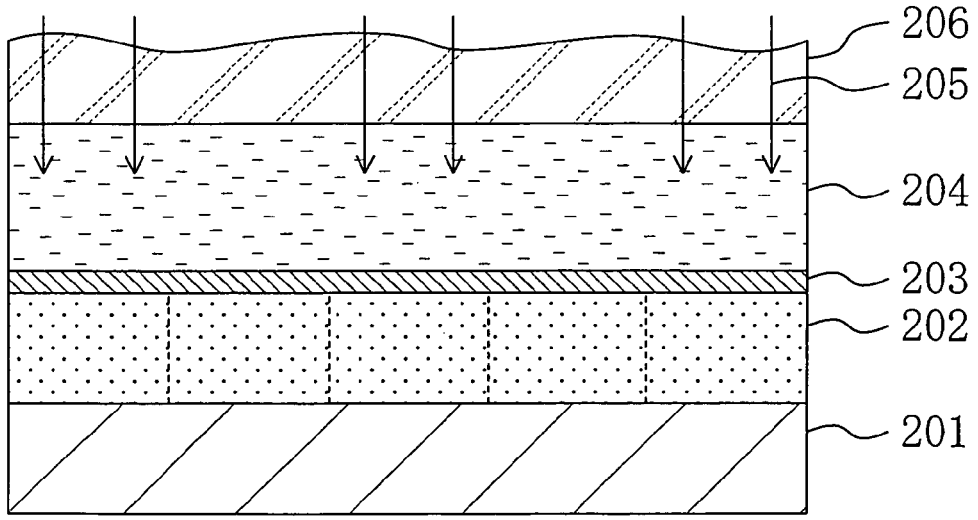

After the annealing, as shown in FIG. 3D, with a liquid 204 of water provided between the barrier film 203 and a projection lens 206 by, for example, the puddle method, pattern exposure is carried out by irradiating the resist film 202 through the barrier film 203 with exposing light 205 of ArF excimer laser with NA of 0.68 having passed through a mask (not shown).

Figure 4A:
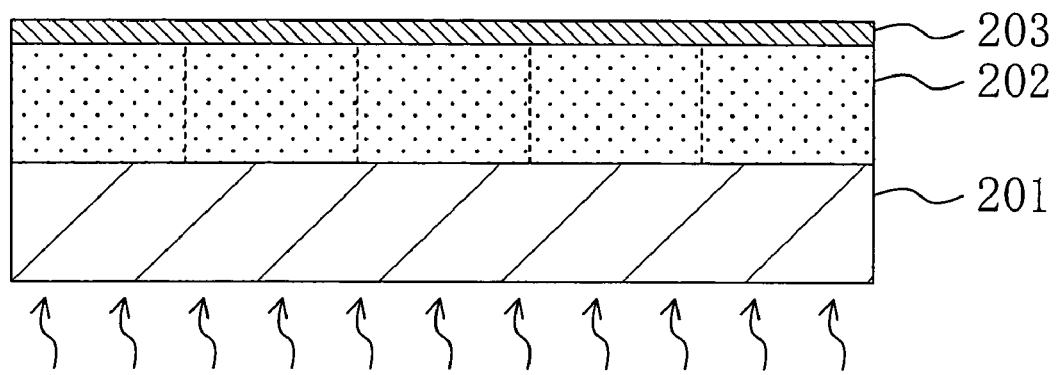
FIGS. 4A and 4B are cross-sectional views for showing other procedures in the pattern formation method of Embodiment 2.

After the pattern exposure, as shown in FIG. 4A, the resist film 202 is baked with a hot plate at a temperature of 105° C. for 60 seconds (post exposure bake).

After the bake, the barrier film 203 is removed and the resist film 202 is developed with a 2.38 wt % tetramethylammonium hydroxide developer. In this manner, a resist pattern 202a made of an unexposed portion of the resist film 202 and having a line width of 0.09 μm is formed in a good shape as shown in FIG. 4B.

Figure 4B:
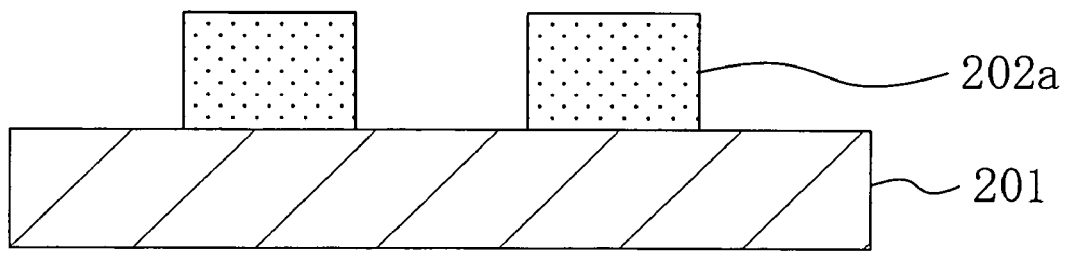

In this manner, according to Embodiment 2, the barrier film 203 formed on the resist film 202 in the barrier film forming step shown in FIG. 3B includes a plasticizer (that is, diisononyl adipate), and hence, the barrier film 203 can be sufficiently removed in the barrier film removing step shown in FIG. 4B. As a result, the resist pattern 202a can be formed in a good shape without producing residues.

In addition, in Embodiment 2, since the barrier film 203 is annealed for improving the denseness as shown in FIG. 3C before the pattern exposure, the insolubility of the barrier film 203 in the liquid (water) 204 is increased. Therefore, the function of the barrier film 203 as a barrier for preventing the acid generator or the like from eluting from the resist film 202 into the liquid 204 can be improved.

Figure 11:
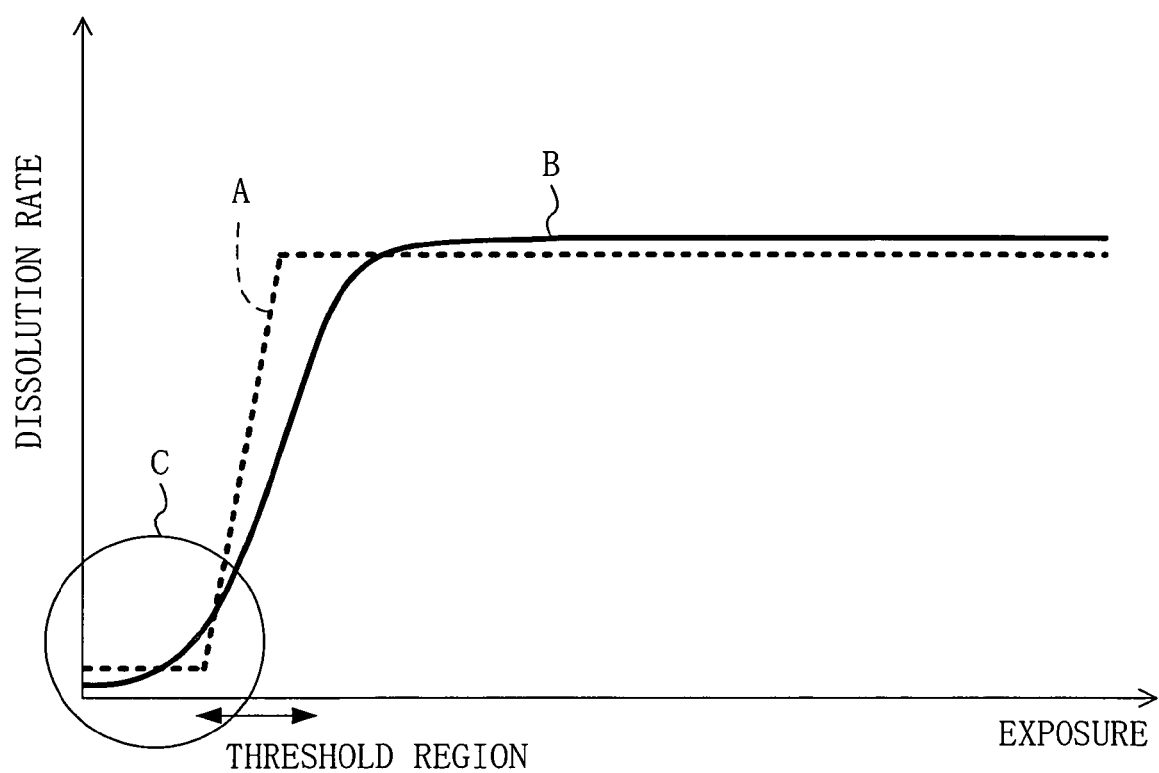
FIG. 11 is a graph for explaining control of solubility of a resist in the pattern formation method of this invention.

Furthermore, as described with reference to FIG. 11, since the barrier film 203 is removed during the development in Embodiment 2, the dissolution characteristic of the resist film 203 can be controlled.

Embodiment 3

A pattern formation method according to Embodiment 3 of the invention will now be described with reference to FIGS. 5A through 5D and 6A through 6C.

First, a positive chemically amplified resist material having the following composition is prepared:

| | |
|---|---|
| Base polymer: poly((norbornene-5-methylene-t-butyl-carboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 5A:
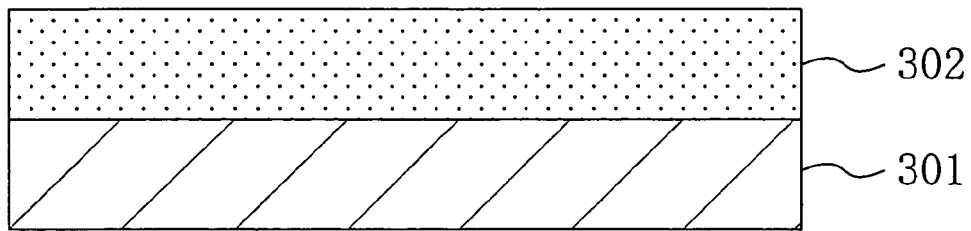
FIGS. 5A, 5B, 5C and 5D are cross-sectional views for showing procedures in a pattern formation method according to Embodiment 3 of the invention.

Next, as shown in FIG. 5A, the aforementioned chemically amplified resist material is applied on a substrate 301 so as to form a resist film 302 with a thickness of 0.35 μm.

Figure 5B:
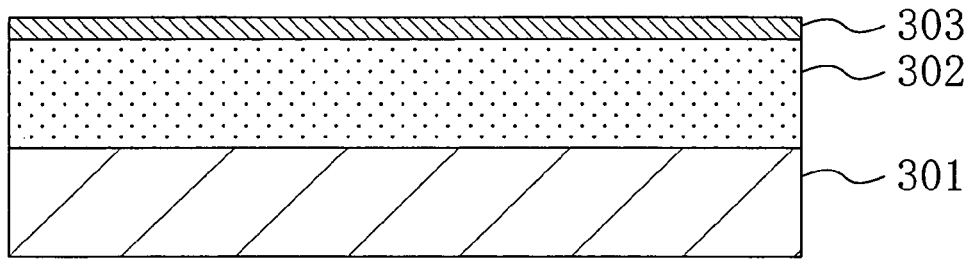

Then, as shown in FIG. 5B, a barrier film 303 having a thickness of 0.03 μm and made of a barrier film material having the following composition is formed on the resist film 302 by, for example, the spin coating:

| | |
|---|---|
| Base polymer: polyvinyl hexafluoroisopropyl alcohol | 1 g |
| Solvent: n-butyl alcohol | 20 g |

Figure 5C:
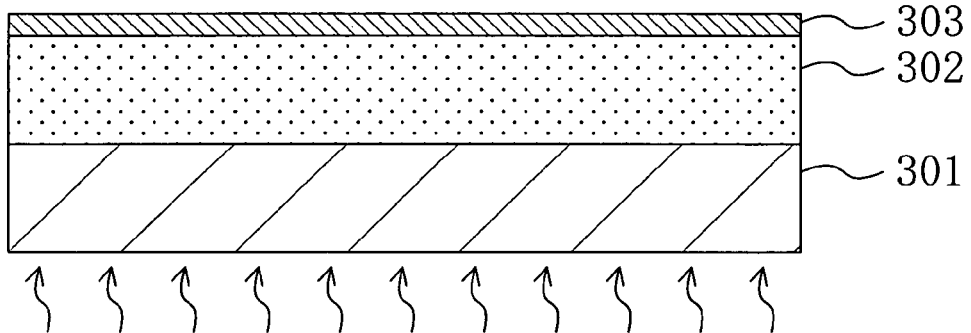

Next, as shown in FIG. 5C, the barrier film 303 is annealed with a hot plate at a temperature of 120° C. for 90 seconds, so as to improve the denseness of the barrier film 303.

Figure 5D:
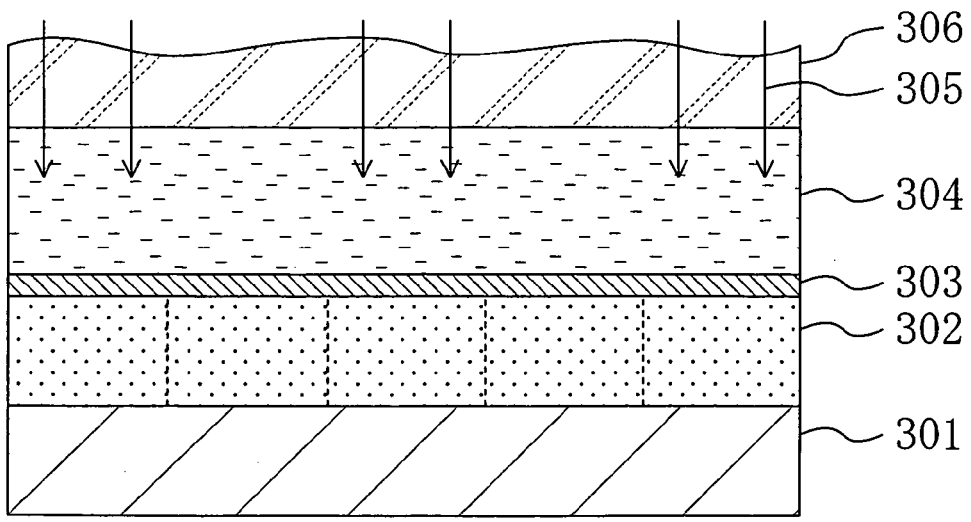

Then, as shown in FIG. 5D, with a liquid 304, which includes 5 wt % of cesium sulfate ($Cs_2SO_4$) for increasing the refractive index, provided between the barrier film 303 and a projection lens 306 by, for example, the puddle method, pattern exposure is carried out by irradiating the resist film 302 through the barrier film 303 with exposing light 305 of ArF excimer laser with NA of 0.68 having passed through a mask (not shown).

Figure 6A:
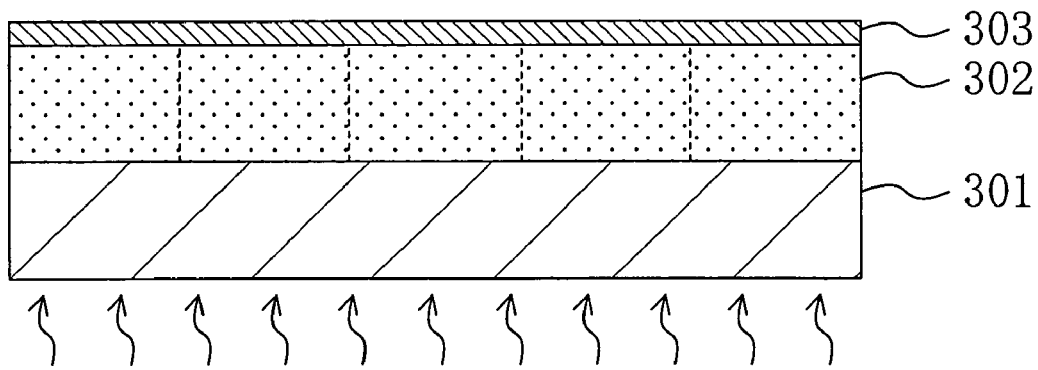
FIGS. 6A, 6B and 6C are cross-sectional views for showing other procedures in the pattern formation method of Embodiment 3.

After the pattern exposure, as shown in FIG. 6A, the resist film 302 is baked with a hot plate at a temperature of 105° C. for 60 seconds (post exposure bake).

Figure 6B:
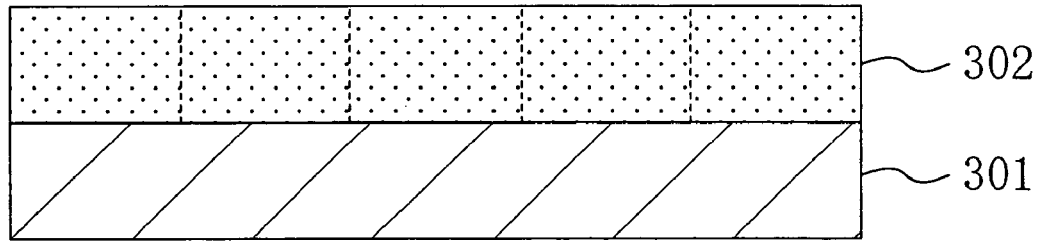
Figure 6C:
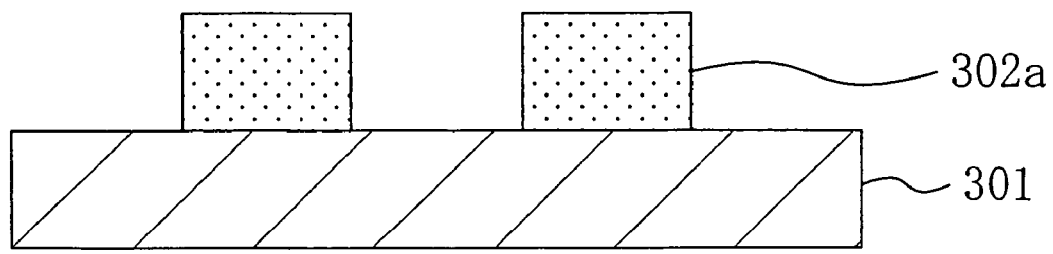

Next, as shown in FIG. 6B, after removing the barrier film 303 with isoamyl alcohol, the resultant resist film 302 is developed with a 2.38 wt % tetramethylammonium hydroxide developer. In this manner, a resist pattern 302a made of an unexposed portion of the resist film 302 and having a line width of 0.09 μm is formed in a good shape as shown in FIG. 6C.

In this manner, according to Embodiment 3, the barrier film 303 including the alcohol solvent is removed with the isoamyl alcohol in the barrier film removing step shown in FIG. 6B, and hence, the barrier film 303 can be sufficiently removed. As a result, the resist pattern 302a is formed in a good shape without producing residues.

In addition, in Embodiment 3, since the barrier film 303 is annealed for improving the denseness as shown in FIG. 5C before the pattern exposure, the insolubility of the barrier film 303 in the liquid 304 is increased. Therefore, the function of the barrier film 303 as a barrier for preventing the acid generator or the like from eluting from the resist film 302 into the liquid 304 can be improved.

Embodiment 4

A pattern formation method according to Embodiment 4 of the invention will now be described with reference to FIGS. 7A through 7D and 8A through 8C.

First, a positive chemically amplified resist material having the following composition is prepared:

| | |
|---|---|
| Base polymer: poly((norbornene-5-methylene-t-butyl-carboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 7A:
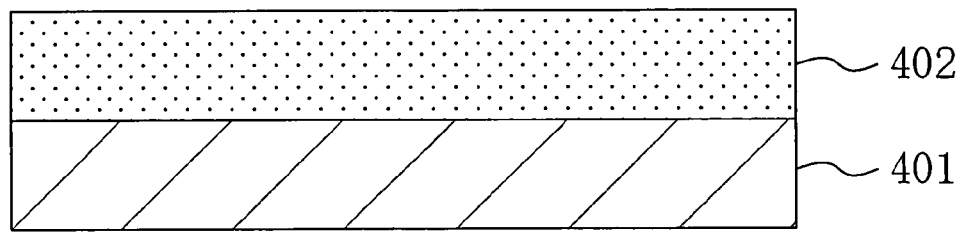
FIGS. 7A, 7B, 7C and 7D are cross-sectional views for showing procedures in a pattern formation method according to Embodiment 4 of the invention.

Next, as shown in FIG. 7A, the aforementioned chemically amplified resist material is applied on a substrate 401 so as to form a resist film 402 with a thickness of 0.35 μm.

Figure 7B:
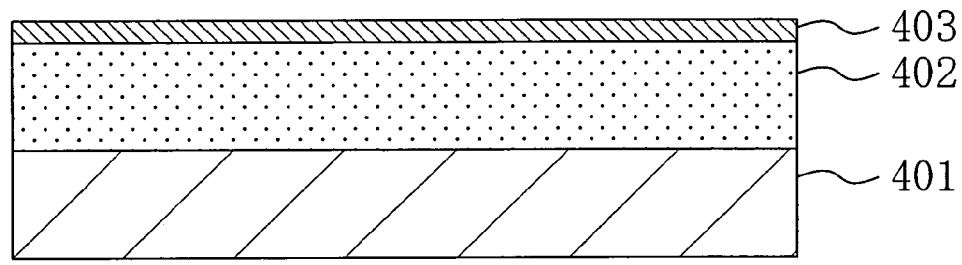

Then, as shown in FIG. 7B, a barrier film 403 having a thickness of 0.10 μm and made of a barrier film material having the following composition is formed on the resist film 402 by, for example, the spin coating:

| | |
|---|---|
| Base polymer: polyvinyl hexafluoroisopropyl alcohol | 1 g |
| Solvent: n-butyl alcohol | 20 g |

Figure 7C:
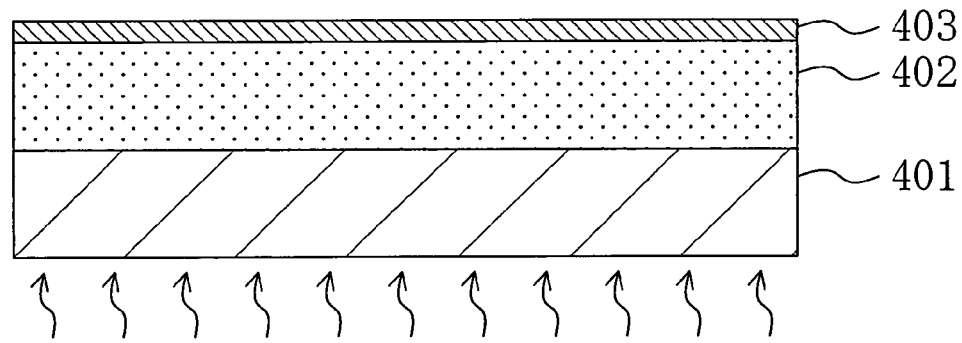

Next, as shown in FIG. 7C, the barrier film 403 is annealed with a hot plate at a temperature of 120° C. for 90 seconds, so as to improve the denseness of the barrier film 403.

Figure 7D:
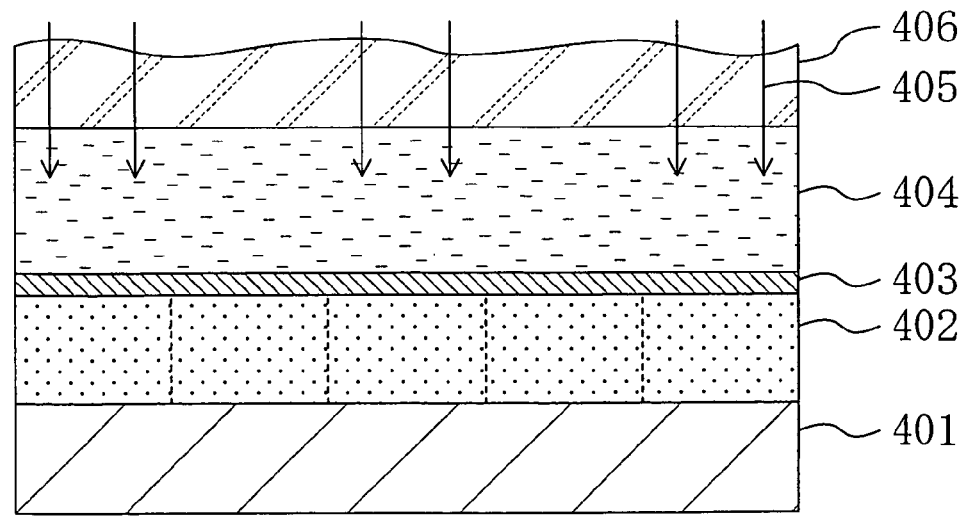

After the annealing, as shown in FIG. 7D, with a liquid 404 of water provided between the barrier film 403 and a projection lens 406 by, for example, the puddle method, pattern exposure is carried out by irradiating the resist film 402 through the barrier film 403 with exposing light 405 of ArF excimer laser with NA of 0.68 having passed through a mask (not shown).

Figure 8A:
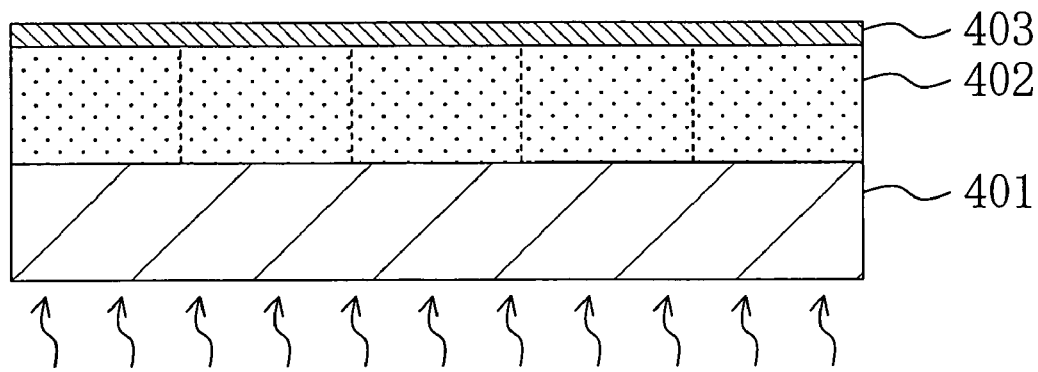
FIGS. 8A, 8B and 8C are cross-sectional views for showing other procedures in the pattern formation method of Embodiment 4.

After the pattern exposure, as shown in FIG. 8A, the resist film 402 is baked with a hot plate at a temperature of 105° C. for 60 seconds (post exposure bake).

Figure 8B:
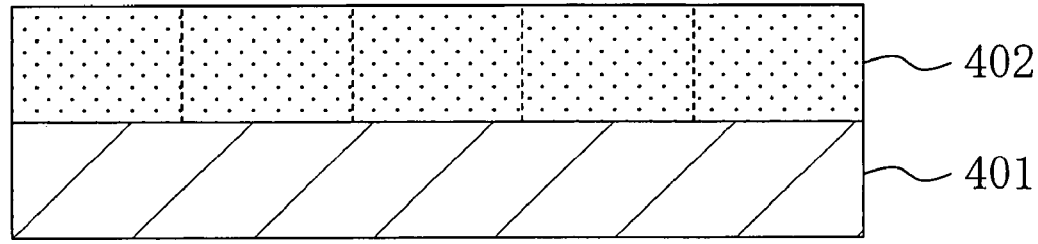
Figure 8C:
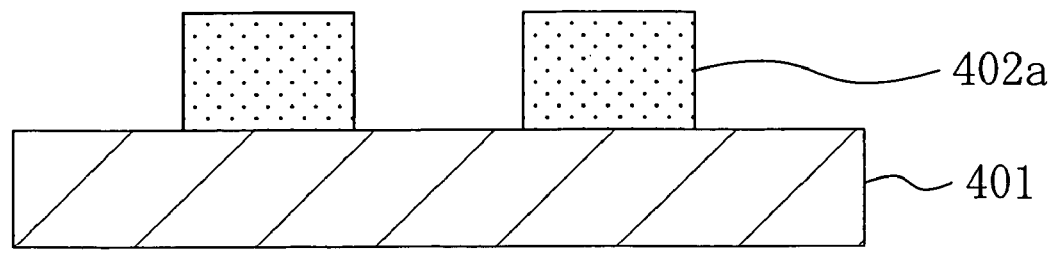
Figure 9A:
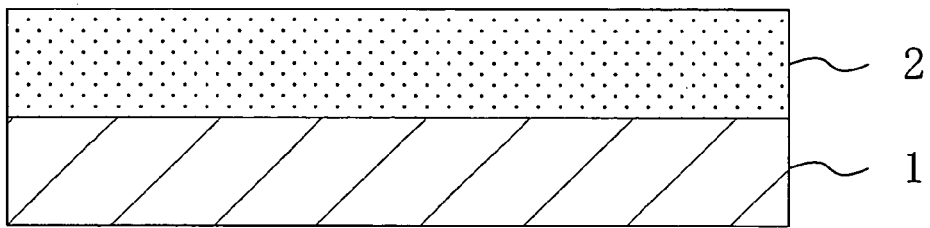
FIGS. 9A, 9B, 9C and 9D are cross-sectional views for showing procedures in a conventional pattern formation method.
Figure 9B:
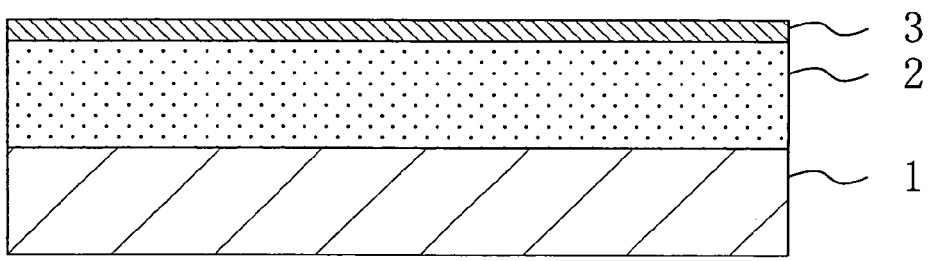
Figure 9C:
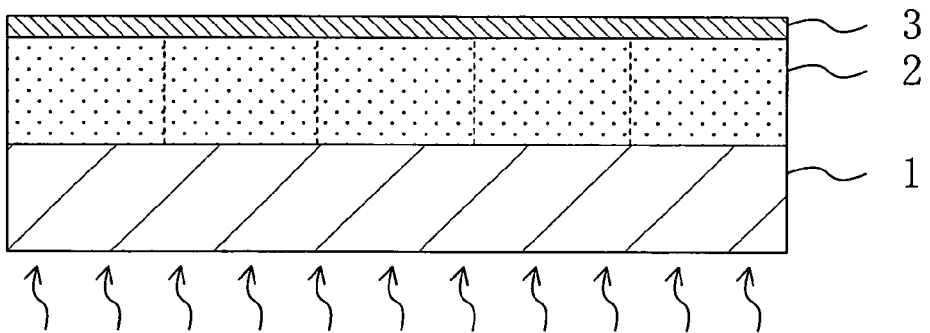
Figure 9D:
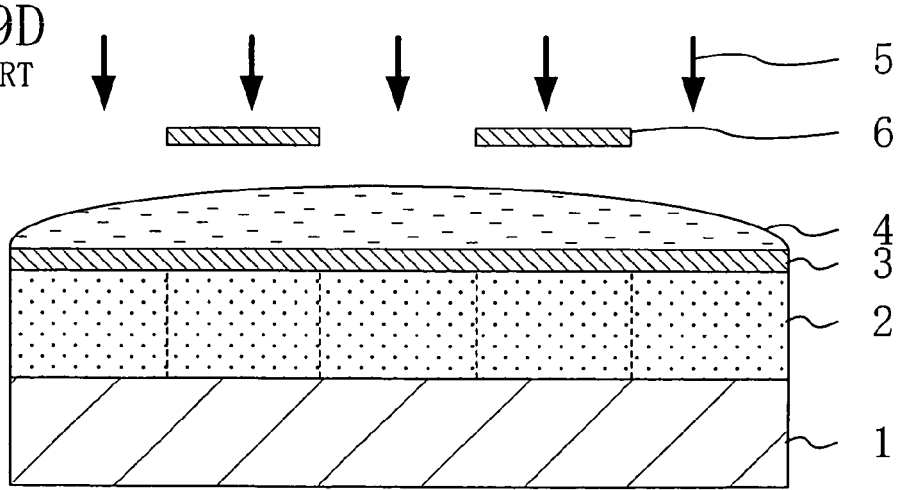
Figure 10A:
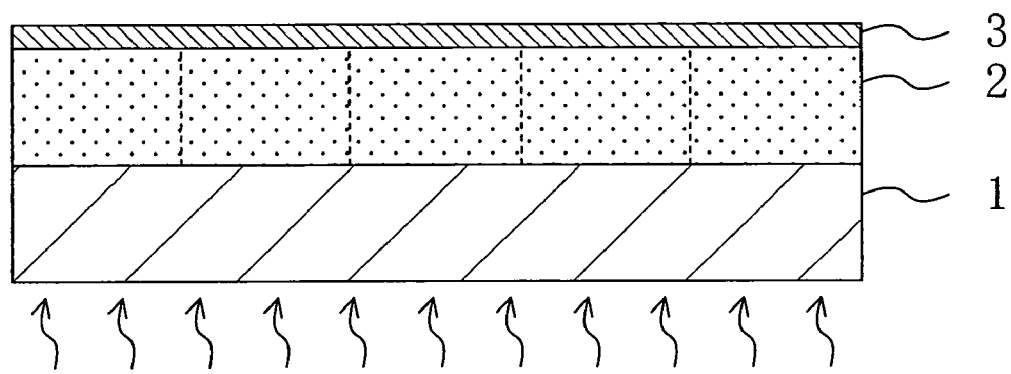
FIGS. 10A and 10B are cross-sectional views for showing other procedures in the conventional pattern formation method.
Figure 10B:
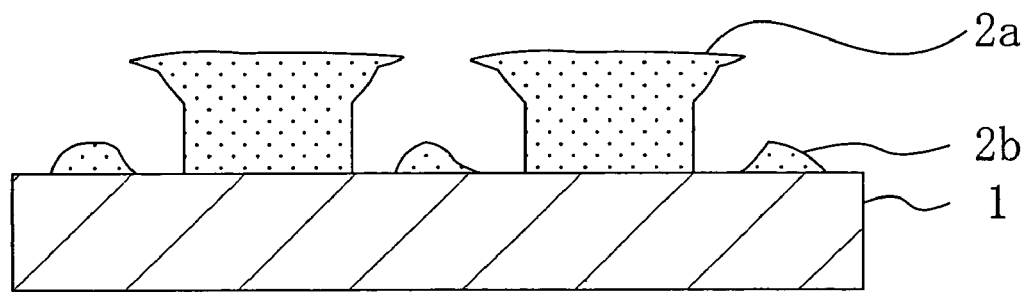

Next, as shown in FIG. 8B, after removing the barrier film 403 with a 1.0 wt % tetramethylammonium hydroxide aqueous solution (diluted alkaline developer) warmed to, for example, 30° C., the resultant resist film 402 is developed with a 2.38 wt % tetramethylammonium hydroxide developer. In this manner, a resist pattern 402a made of an unexposed portion of the resist film 402 and having a line width of 0.09 μm is formed in a good shape as shown in FIG. 8C.

In this manner, according to Embodiment 4, the barrier film 403 including the alkali-soluble polymer, that is, polyvinyl hexafluoroisopropyl alcohol, is removed with the warmed alkaline diluted developer in the barrier film removing step shown in FIG. 8B, and hence, the barrier film 403 can be sufficiently removed. As a result, the resist pattern 402a is formed in a good shape without producing residues.

In addition, in Embodiment 4, since the barrier film 403 is annealed for improving the denseness as shown in FIG. 7C before the pattern exposure, the insolubility of the barrier film 403 in the immersion liquid 404 is increased. Therefore, the function of the barrier film 403 as a barrier for preventing the acid generator or the like from eluting from the resist film 402 into the immersion liquid 404 can be improved.

It is noted that the alkaline aqueous solution used for removing the barrier film 403 in Embodiment 4 is not limited to the tetramethylammonium hydroxide aqueous solution but may be a tetraethylammonium hydroxide aqueous solution or a choline aqueous solution.

In each of Embodiments 1 through 4, the thickness of the barrier film is not limited to a thickness approximately not less than 0.03 μm and not more than 0.10 μm. The lower limit of the thickness is a thickness sufficient for preventing a component of the resist film from eluting into the immersion liquid or preventing the immersion liquid from permeating into the resist film, and the upper limit is a thickness not preventing the transmission of the exposing light and easily removed. Although the annealing is performed for improving the denseness of the barrier film in each of Embodiments 2 through 4, the annealing of the barrier film is not always necessary but may be performed appropriately depending upon the composition, the thickness or the like of the barrier film. Accordingly, the barrier film of Embodiment 1 may be annealed after the formation.

Also, cesium sulfate is included in the immersion liquid in Embodiment 3 for increasing the refractive index by using an acidic immersion liquid, and phosphoric acid ($H_3PO_4$) may be included instead. Furthermore, an acidic solution including cesium sulfate or phosphoric acid may be used as the immersion liquid also in Embodiments 1, 2 and 4. Also, the liquid may include a surfactant.

Although the exposing light is ArF excimer laser in each of Embodiments 1 through 4, the exposing light is not limited to it but may be KrF excimer laser, $Xe_2$ laser, $F_2$ laser, ArKr laser or $Ar_2$ laser instead.

Furthermore, the puddle method is employed for providing the immersion liquid onto the barrier film in each embodiment, which does not limit the invention, and for example, a dip method in which the whole substrate is dipped in the immersion liquid may be employed instead.

Moreover, although a positive chemically amplified resist is used for forming the resist film in each embodiment, the present invention is applicable also to a negative chemically amplified resist. Also, the resist is not limited to a chemically amplified resist but may be a general resist.

As described so far, according to the pattern formation method of this invention, a barrier film formed on a resist film can be sufficiently removed, so that a resist pattern can be formed in a good shape. Accordingly, the present invention is useful as a method for forming a fine pattern to be employed in fabrication process or the like for semiconductor devices.

What is claimed is:

1. A pattern formation method comprising the steps of:
   forming a resist film on a substrate;
   forming a barrier film including a base polymer and a plasticizer on said resist film;
   performing pattern exposure by selectively irradiating said resist film through said barrier film with exposing light with a liquid provided on said barrier film;

removing said barrier film;

forming, after the pattern exposure, a resist pattern made of said resist film by developing said resist film after removing said barrier film; and annealing said barrier film before the step of performing pattern exposure.

2. The pattern formation method of claim 1, wherein said plasticizer is phthalate ester, adipate ester, azelate ester, sebacate ester, phosphate ester, trimellitate ester, citrate ester, epoxy, or chlorinated paraffin.

3. The pattern formation method of claim 2, wherein said phthalate ester is dimethyl phthalate, diethyl phthalate, dibutyl phthalate, di-2-ethylhexyl phthalate, di-n-octyl phthalate, diisononyl phthalate, dinonyl phthalate, diisodecyl phthalate or butyl benzyl phthalate, said adipate ester is dioctyl adipate or diisononyl adipate, said azelate ester is dioctyl azelate, said sebacate ester is dibutyl sebacate or dioctyl sebacate, said phosphate ester is tricresyl phosphate, said trimellitate ester is trioctyl trimellitate, said citrate ester is acetyl tributyl citrate, and said epoxy is epoxidized soybean oil.

4. The pattern formation method of claim 1, wherein said liquid is water or an acidic solution.

5. The pattern formation method of claim 4, wherein said acidic solution is a cesium sulfate aqueous solution or a phosphoric acid aqueous solution.

6. The pattern formation method of claim 1, wherein said exposing light is KrF excimer laser, Xe2 laser, ArF excimer laser, F2 laser, KrAr laser or Ar2 laser.

7. The pattern formation method of claim 1, wherein said plasticizer includes an ester bond.

8. The pattern formation method of claim 1, wherein an amount of said plasticizer is not less than 0.1 wt%, and not more than 30 wt % based on said base polymer.

9. A pattern formation method comprising the steps of:

forming a resist film on a substrate;

forming a barrier film including a base polymer and a plasticizer on said resist film;

performing pattern exposure by selectively irradiating said resist film through said barrier film with exposing light with a liquid provided on said barrier film;

removing said barrier film and forming a resist pattern made of said resist film by developing said resist film after the pattern exposure; and annealing said barrier film before the step of performing pattern exposure.

10. The pattern formation method of claim 9, wherein said plasticizer is phthalate ester, adipate ester, azelate ester, sebacate ester, phosphate ester, trimellitate ester, citrate ester, epoxy, or chlorinated paraffin.

11. The pattern formation method of claim 10, wherein said phthalate ester is dimethyl phthalate, diethyl phthalate, dibutyl phthalate, di-2-ethyihexyl phthalate, di-n-octyl phthalate, diisononyl phthalate, dinonyl phthalate, diisodecyl phthalate or butyl benzyl phthalate, said adipate ester is dioctyl adipate or diisononyl adipate, said azelate ester is dioctyl azelate, said sebacate ester is dibutyl sebacate or dioctyl sebacate, said phosphate ester is tricresyl phosphate, said trimellitate ester is trioctyl trimellitate, said citrate ester is acetyl tributyl citrate, and said epoxy is epoxidized soybean oil.

12. The pattern formation method of claim 9, wherein said liquid is water or an acidic solution.

13. The pattern formation method of claim 12, wherein said acidic solution is a cesium sulfate aqueous solution or a phosphoric acid aqueous solution.

14. The pattern formation method of claim 9, wherein said exposing light is KrF excimer laser, $Xe_2$ laser, ArF excimer laser, $F_2$ laser, KrAr laser or $Ar_2$ laser.

15. The pattern formation method of claim 9, wherein said plasticizer includes an ester bond.

16. The pattern formation method of claim 9, wherein an amount of said plasticizer is not less than 0.1 wt %, and not more than 30 wt % based on said base polymer.

17. A pattern formation method comprising the steps of:

forming a resist film on a substrate;

forming a barrier film including a base polymer, a plasticizer, and an alcohol solvent on said resist film;

performing pattern exposure by selectively irradiating said resist film through said barrier film with exposing light with a liquid provided on said barrier film;

removing said barrier film with an alcohol solution;

forming, after the pattern exposure, a resist pattern made of said resist film by developing said resist film after removing said barrier film; and annealing said barrier film before the step of performing pattern exposure.

18. The pattern formation method of claim 17, wherein said plasticizer is phthalate ester, adipate ester, azelate ester, sebacate ester, phosphate ester, trimellitate ester, citrate ester, epoxy, or chlorinated paraffin.

19. The pattern formation method of claim 18, wherein said phthalate ester is dimethyl phthalate, diethyl phthalate, dibutyl phthalate, di-2-ethylhexyl phthalate, di-n-octyl phthalate, diisononyl phthalate, dinonyl phthalate, diisodecyl phthalate or butyl benzyl phthalate, said adipate ester is dioctyl adipate or diisononyl adipate, said azelate ester is dioctyl azelate, said sebacate ester is dibutyl sebacate or dioctyl sebacate, said phosphate ester is tricresyl phosphate, said trimellitate ester is trioctyl trimellitate, said citrate ester is acetyl tributyl citrate, and said epoxy is epoxidized soybean oil.

20. The pattern formation method of claim 17, wherein alcohol included in said alcohol solution is methanol, ethanol, isopropyl alcohol, isobutyl alcohol, n-butyl alcohol, isoamyl alcohol, n-amyl alcohol or n-hexyl alcohol.

21. The pattern formation method of claim 17, wherein said liquid is water or an acidic solution.

22. The pattern formation method of claim 21, wherein said acidic solution is a cesium sulfate aqueous solution or a phosphoric acid aqueous solution.

23. The pattern formation method of claim 17, wherein said exposing light is KrF excimer laser, $Xe_2$ laser, ArF excimer laser, $F_2$ laser, KrAr laser or $Ar_2$ laser.

24. A pattern formation method comprising the steps of:

forming a resist film on a substrate;

forming a barrier film including an alkali-soluble polymer on said resist film;

performing pattern exposure by selectively irradiating said resist film through said barrier film with exposing light with a liquid provided on said barrier film;

removing said barrier film with a warmed alkaline aqueous solution;

forming, after the pattern exposure, a resist pattern made of said resist film by developing said resist film after removing said barrier film; and annealing said barrier film before the step of performing pattern exposure.

25. The pattern formation method of claim 24, wherein said barrier film includes a plasticizer.

26. The pattern formation method of claim 25, wherein said plasticizer is phthalate ester, adipate ester, azelate ester, sebacate ester, phosphate ester, trimellitate ester, citrate ester, epoxy, or chlorinated paraffin.

27. The pattern formation method of claim 26, wherein said phthalate ester is dimethyl phthalate, diethyl phthalate, dibutyl phthalate, di-2-ethyihexyl phthalate, di-n-octyl phthalate, diisononyl phthalate, dinonyl phthalate, diisodecyl phthalate or butyl beuzyl phthalate, said adipate ester is dioctyl adipate or diisononyl adipate, said azelate ester is dioctyl azelate, said sebacate ester is dibutyl sebacate or dioctyl sebacate, said phosphate ester is tricresyl phosphate, said trimellitate ester is trioctyl trimellitate, said citrate ester is acetyl tributyl citrate, and said epoxy is epoxidized soybean oil.

28. The pattern formation method of claim 24, wherein a temperature of said warmed alcohol aqueous solution is not less than room temperature.

29. The pattern formation method of claim 24, wherein said alkaline aqueous solution is a tetramethylammonium hydroxide aqueous solution, a tetraethylammonium hydroxide aqueous solution or a choline aqueous solution.

30. The pattern formation method of claim 24, wherein said liquid is water or an acidic solution.

31. The pattern formation method of claim 30, wherein said acidic solution is a cesium sulfate aqueous solution or a phosphoric acid aqueous solution.

32. The pattern formation method of claim 24, wherein said exposing light is KrF excimer laser, $Xe_2$ laser, ArF excimer laser, $F_2$ laser, KrAr laser or $Ar_2$ laser.

* * * * *